(12) United States Patent
Wu et al.

(10) Patent No.: US 12,568,753 B2
(45) Date of Patent: Mar. 3, 2026

(54) LED DISPLAYS WITH REDUCED OPTICAL CROSSTALK

(71) Applicant: Applied Materials, Inc., Santa Clara, CA (US)

(72) Inventors: Chung-Chih Wu, Taipei (TW); Po-Jui Chen, Taipei (TW); Hoang Yan Lin, Taipei (TW); Guo-Dong Su, Taipei (TW); Wei-Kai Lee, Taipei (TW); Wan-Yu Lin, Taipei (TW); Byung Sung Kwak, Mountain View, CA (US); Robert Jan Visser, Menlo Park, CA (US); Chi-Jui Chang, Taichung (TW)

(73) Assignee: Applied Materials, Inc., Santa Clara, CA (US)

( * ) Notice: Subject to any disclaimer, the term of this patent is extended or adjusted under 35 U.S.C. 154(b) by 477 days.

(21) Appl. No.: 17/493,402

(22) Filed: Oct. 4, 2021

(65) Prior Publication Data

US 2023/0109619 A1 Apr. 6, 2023

(51) Int. Cl.
*H10K 50/86* (2023.01)
*H10K 50/85* (2023.01)
(Continued)

(52) U.S. Cl.
CPC ........... *H10K 50/865* (2023.02); *H10K 50/85* (2023.02); *H10K 59/38* (2023.02); *H10K 71/00* (2023.02); *H10K 2102/351* (2023.02)

(58) Field of Classification Search
CPC ...... H10K 50/865; H10K 50/85; H10K 59/38; H10K 71/00; H10K 2102/351
See application file for complete search history.

(56) References Cited

U.S. PATENT DOCUMENTS

| | | | |
|---|---|---|---|
| 10,914,874 B2 | 2/2021 | Ahmed et al. | |
| 2005/0194896 A1 | 9/2005 | Sugita et al. | |
| 2012/0168796 A1 | 7/2012 | Moon et al. | |
| 2012/0250303 A1* | 10/2012 | Asaki | H10K 59/38 362/230 |

(Continued)

FOREIGN PATENT DOCUMENTS

| | | |
|---|---|---|
| CN | 109863831 A | 6/2019 |
| JP | 2012084391 A | 4/2012 |

(Continued)

OTHER PUBLICATIONS

Application No. PCT/US2022/044629, International Search Report and Written Opinion, Mailed On Jan. 13, 2023, 11 pages.
(Continued)

*Primary Examiner* — Nduka E Ojeh
(74) *Attorney, Agent, or Firm* — Kilpatrick Townsend & Stockton LLP

(57) ABSTRACT

A light-emitting pixel structure is described that may include a group of light-emitting diode structures, where each of the light-emitting diode structures is operable to emit light characterized by a different peak emission wavelength. The structures may also include a patterned light absorption barrier characterized by a group of openings in the barrier, where each of the openings permit a transmission of a portion of the light from one of the light-emitting diode structures through the barrier. The structures may further include a metasurface layer operable to change a direction of at least some of the light transmitted through the openings of the patterned light absorption barrier from the light-emitting diode structures.

20 Claims, 6 Drawing Sheets

(51) Int. Cl.
  *H10K 59/38* (2023.01)
  *H10K 71/00* (2023.01)
  *H10K 102/00* (2023.01)

(56) References Cited

U.S. PATENT DOCUMENTS

| | | | |
|---|---|---|---|
| 2014/0027725 A1 | 1/2014 | Lim et al. | |
| 2015/0200382 A1 | 7/2015 | Moon et al. | |
| 2019/0189704 A1* | 6/2019 | Yang | H10K 59/121 |
| 2019/0371866 A1 | 12/2019 | Kim et al. | |
| 2019/0371965 A1* | 12/2019 | Na | G06T 7/521 |
| 2021/0104581 A1* | 4/2021 | Fukuoka | H10K 50/852 |
| 2021/0234123 A1* | 7/2021 | Yang | H10K 50/854 |
| 2022/0239883 A1* | 7/2022 | Wong | H04N 13/111 |
| 2022/0352249 A1* | 11/2022 | Park | H10H 29/142 |
| 2022/0352419 A1* | 11/2022 | Yang | H01L 33/54 |
| 2023/0157123 A1* | 5/2023 | Kubota | G09F 9/302 |
| | | | 257/40 |

FOREIGN PATENT DOCUMENTS

| | | | |
|---|---|---|---|
| JP | 2014103424 A | 6/2014 | |
| JP | 2016035830 A | 3/2016 | |
| JP | 2017156455 A | 9/2017 | |
| JP | 2020507112 A | 3/2020 | |
| JP | 2020510872 A | 4/2020 | |
| JP | 2020098910 A | 6/2020 | |
| JP | 2021061234 A | 4/2021 | |
| KR | 20180027706 A | 3/2018 | |
| KR | 20190072821 A | 6/2019 | |
| KR | 20190138719 A | 12/2019 | |
| TW | 201937235 A | 9/2019 | |
| WO | 2020011101 A1 | 1/2020 | |
| WO | 2021149470 A1 | 7/2021 | |

OTHER PUBLICATIONS

Japanese Application No. 2024-520593, Office Action mailed on Jan. 5, 2026, 17 pages (9 pages of English Translation and 8 pages of original document).

Korean Application No. 10-2024-7014578, Notice of Decision to Grant mailed on Nov. 28, 2025, 8 pages (3 pages of English Translation and 5 pages of original document).

Taiwanese Application No. 113150801, Office Action mailed on Nov. 10, 2025, 7 pages (1 page of English Translation and 6 pages of original document).

* cited by examiner

100

300
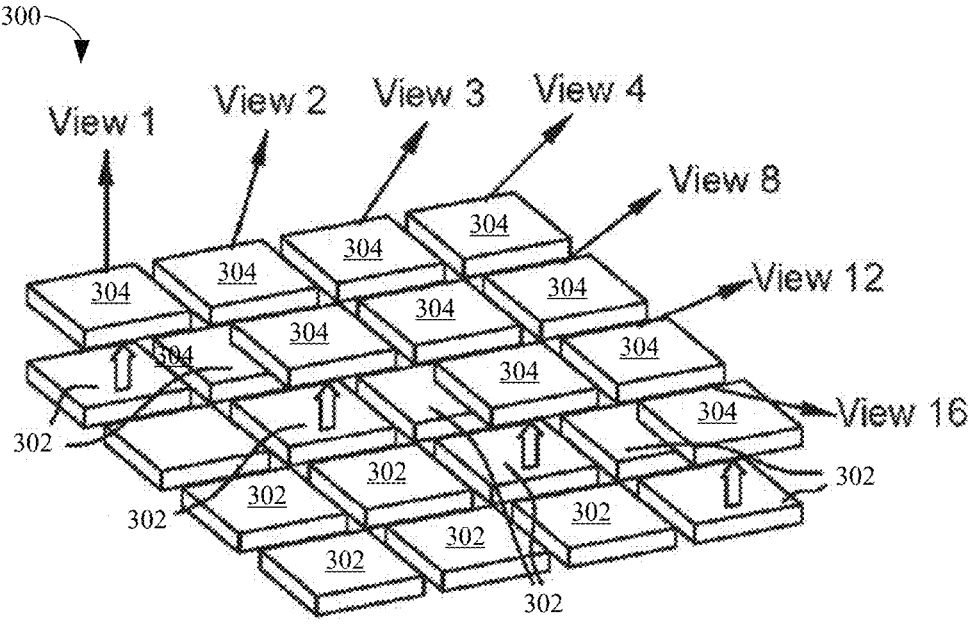
*FIG. 3A*
320
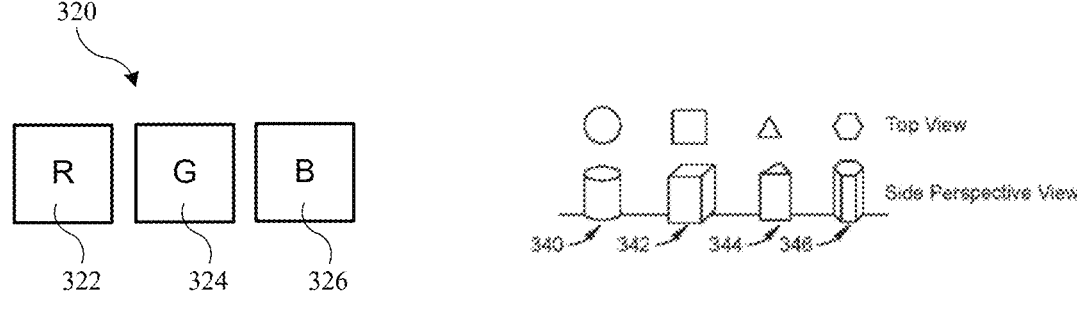
*FIG. 3B*                    *FIG. 3C*

400

Form Light-Emitting Structure — 405

Form Median Layers — 410

Form Color Filters — 415

Form Patterned Light Absorption Layer — 420

Form Metasurface Layer — 425

Incorporate Light-Emitting Pixel into Display — 430

LED DISPLAYS WITH REDUCED OPTICAL CROSSTALK

TECHNICAL FIELD

The present technology relates to light-emitting diode (LED) structures and fabrication processes. More specifically, the present technology relates to LED displays and methods of making them.

BACKGROUND

Light-emitting-diode (LED) display devices made from millions of micron-sized pixels are made possible by fabrication processes that produce intricately patterned material layers on substrate surfaces. Producing patterned material on a substrate requires controlled methods for deposition and removal of materials. However, with new device designs, producing high-quality layers of material with very precise dimensions may be challenging.

Thus, there is a need for improved systems and methods that can be used to produce high-quality materials and structures for LED display devices. These and other needs are addressed by the present technology.

SUMMARY

The present technology includes exemplary light-emitting pixel structures that include a group of light-emitting diode structures, where each of the light-emitting diode structures is operable to emit light characterized by a different peak emission wavelength. The structures also include a patterned light absorption barrier characterized by a group of openings in the barrier. Each of the barrier openings permits transmission of a portion of the light from one of the light-emitting diode structures through the barrier. The structures may further include a metasurface layer operable to change a direction of at least some of the light transmitted through the openings of the patterned light absorption barrier from the light-emitting diode structures.

In additional embodiments, the patterned light absorption barrier is operable to block a second portion of the light from the light-emitting diode structures that is characterized by a divergence angle of greater than or about 30°, where the divergence angle is an angle between a first line that is perpendicular to an absorbing surface of the patterned light absorption barrier and a second line that is parallel to a direction of the second portion of the light. In further embodiments, the patterned light absorption barrier is operable to reduce emission intensity of a sidelobe image from the light-emitting pixel structure by greater than or about 90% compared to a light-emitting pixel structure without the patterned light absorption barrier. In still further embodiments, the openings in the patterned light absorption barrier are characterized by a non-zero width that is less than or about 20 μm. In yet additional embodiments, the patterned light absorption barrier is separated from the group of light-emitting diode structures by a height that is greater than or about 50 μm. In more embodiments, the patterned light absorption barrier is characterized by a thickness that is greater than or about 1 μm. In still more embodiments, the group of light-emitting diode structures includes organic light-emitting diode (OLED) structures. In yet further embodiments, the light-emitting pixel structures are part of a three-dimensional light field display.

The present technology also includes additional light-emitting pixel structures that may include a light emission layer that further includes a group of light-emitting diode structures. The structures also include a light absorption barrier positioned a distance from the light emission layer, where the patterned light absorption barrier defines a group of openings in the barrier to transmit light from the group of light-emitting diode structures through the barrier. The structures may be characterized by a ratio of (i) the distance between the patterned light absorption barrier and the light emission layer, and (ii) a width of each of the openings in the pattern light absorption barrier, that is greater than or about 5:1.

In additional embodiments, the structures may further include a metasurface layer operable to change a direction of at least some of the light transmitted through the openings of the patterned light absorption barrier from the light-emitting diode structures. In further embodiments, the structures may include a color filter directly adjacent to each of the openings in the patterned light absorption barrier, where the color filter is operable to pass light characterized by a wavelength range emitted from a subpixel in the light emission layer while blocking light outside the wavelength range. In still further embodiments, the patterned light absorption barrier is operable to reduce emission intensity of a sidelobe image from the light-emitting pixel structure by greater than or about 90% compared to a light-emitting pixel structure without the patterned light absorption barrier. In yet additional embodiments, the group of light-emitting diode structures in the light emission layer may include directional light-emitting diode structures characterized by a FWHM of emitted light having a divergence angle of less than or about 10°. In more embodiments, the structures may be part of a three-dimensional light field display.

The present technology further includes light-emitting pixel processing methods that may include forming a light-emission layer on a substrate, where the light-emission layer includes a group of diode structures. The methods may further include forming one or more median layers on the light-emission layer, where at least one of the median layers is characterized by an index of refraction less than the light emission layer. The methods may yet further include forming a patterned light absorption barrier on the one or more median layers, where the patterned light absorption barrier defines a group of openings in the barrier to transmit light from the group of light-emitting diode structures through the barrier. The structures may be characterized by a ratio of (i) the distance between the patterned light absorption barrier and the light emission layer, and (ii) a width of each of the openings in the pattern light absorption barrier, that is greater than or about 5:1.

In additional embodiments, the methods may further include forming a metasurface layer on the patterned light absorption barrier, where the metasurface layer is operable to change a direction of at least some of the light transmitted through the openings of the patterned light absorption barrier from the light-emitting diode structures. In further embodiments, the patterned light absorption barrier is operable to reduce an emission intensity of a sidelobe image from the light-emitting pixel by greater than or about 90% compared to a light-emitting pixel without the patterned light absorption barrier. In still further embodiments, the distance between the patterned light absorption barrier and the light emission layer is greater than or about 50 μm. In yet additional embodiments, a FWHM of emitted light from the light-emitting diode structures has a divergence angle of less than or about 10°. In more embodiments, the methods may incorporate the light-emitting pixel into a three-dimensional light field display.

Such technology may provide numerous benefits over conventional light-emitting pixel structures and processing methods. For example, embodiments of the light-emitting pixel structures can dim or eliminate unwanted sidelobe patterns in the light emitted from the structures. Dimming the sidelobes reduces or eliminates ghost images in light field displays that are capable of displaying a three-dimensional image onto a display screen. In further embodiments, the light-emitting pixel structures may include organic light-emitting diode structures (OLEDs) operable to emit light characterized by a high degree of directionality. These high-directionality OLEDs improve the brightness and contrast of images in light field displays compared to displays illuminated with conventional LEDs. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

FIG. 3A shows a 3D light field pixel of a light field display according to embodiments of the present technology.

FIG. 3B shows a light-emitting pixel from a 3D light field pixel of a light field display according to embodiments of the present technology.

FIG. 3C shows a metasurface layer from a 3D light field pixel of a light field display according to embodiments of the present technology.

Figure 1:
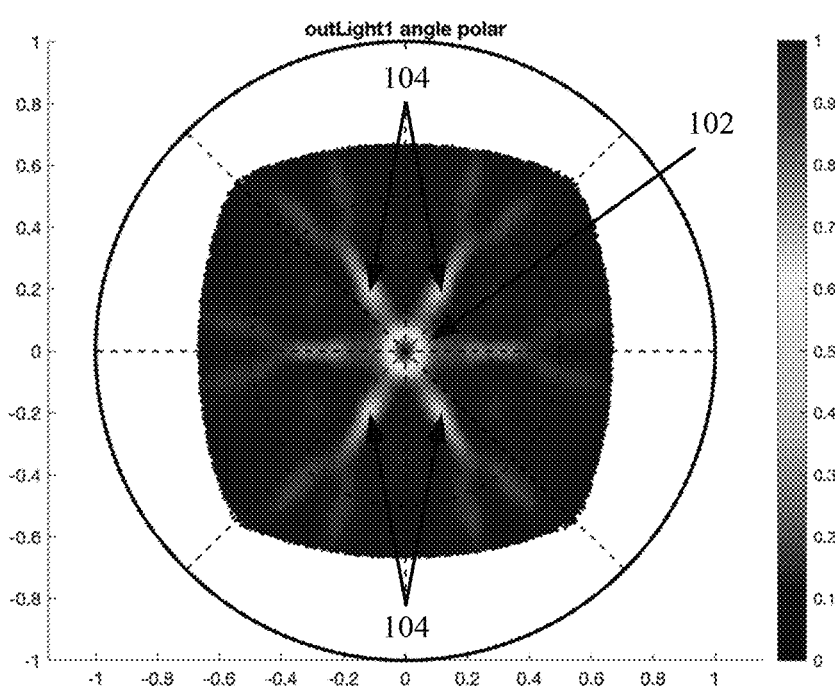
FIG. 1 shows a sidelobe-containing emission spectrum from a subpixel.

Several of the figures are included as schematics. It is to be understood that the figures are for illustrative purposes and are not to be considered of scale unless specifically stated to be of scale. Additionally, as schematics, the figures are provided to aid comprehension and may not include all aspects or information compared to realistic representations and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Light field displays are designed to allow a viewer to see a three-dimensional image on a planar display screen. Light field displays create three-dimensional images by displaying images from multiple viewing angles at the same time. The effect can cause a viewer to see a different view of the displayed image in each eye to create three-dimensional image depth in the plane of the display screen without having to wear customized glasses. It can also allow viewers to see different perspectives of the displayed image depending on their viewing angle. Light field displays can dynamically display three-dimensional images of architectural designs, mechanical parts, fluid dynamics, chemical structures, and anatomical features, among many other types of images. Light field displays have applications in many industries, including entertainment, tool design, architectural design, and healthcare, among others.

Unfortunately, light field displays still face several challenges to improving image quality. Conventional light field displays use conventional light-emitting diodes for illumination that lack the directionality, color range, and brightness contrast needed for sharp three-dimensional images created from multiple component images projected from different angles at the same time. The displays are also characterized by a lot of crosstalk both within the pixels and subpixels as well as between adjacent subpixels. The crosstalk can produce blurred, haloed, and discolored images in the light field display. Crosstalk can also produce ghost images in the display that look like dimmer, offset copies of the main image. As a result of crosstalk and other defects and deficiencies, the projected three-dimensional images in a conventional light field display often appear blurry, dim, and nearly monochromatic.

Some of the challenges with improving image quality in light field displays have been addressed by replacing conventional LEDs with organic light-emitting diode structures (OLEDs) that have a wider range of color in the emitted light, as well as higher contrast between light and dark areas in the displayed image. However, OLEDs have not solved all the problems with using conventional LEDs in light field displays. For example, light field displays using OLEDs still experience a noticeable amount of crosstalk in the form of ghost imaging. In light field displays that display multiple images at the same time to create a three-dimensional effect, there can be multiple ghost images that make the total image look blurry, off-color, and in some cases, practically washed out.

Embodiments of the present technology address crosstalk problems caused by ghost images in light field displays that are illuminated with OLEDs by dimming or outright eliminating the sidelobe patterns in the light emitted from the display. These sidelobes are shown in the two-dimensional graph 100 of light intensity shown in FIG. 1. Graph 100 shows four sidelobes 104 distributed around the central, radial projection of light 102 from an OLED subpixel. While the sidelobes 104 are significantly dimmer than the central projection of light 102, they are still bright enough to create ghost images in the three-dimensional image displayed by a light field display. In embodiments to the present technology, a patterned light absorption barrier is positioned between the OLED structures and a metasurface that directs the light of the displayed image. The absorption barrier blocks light with too high a divergence angle from being displayed. This highly divergent light is what illuminates the sidelobes, and blocking this light eliminates the sidelobes and the ghost images they create in a light field display. The displayed images are significantly sharper due to the dimming or elimination of the sidelobe-generated ghost images.

Figure 2:
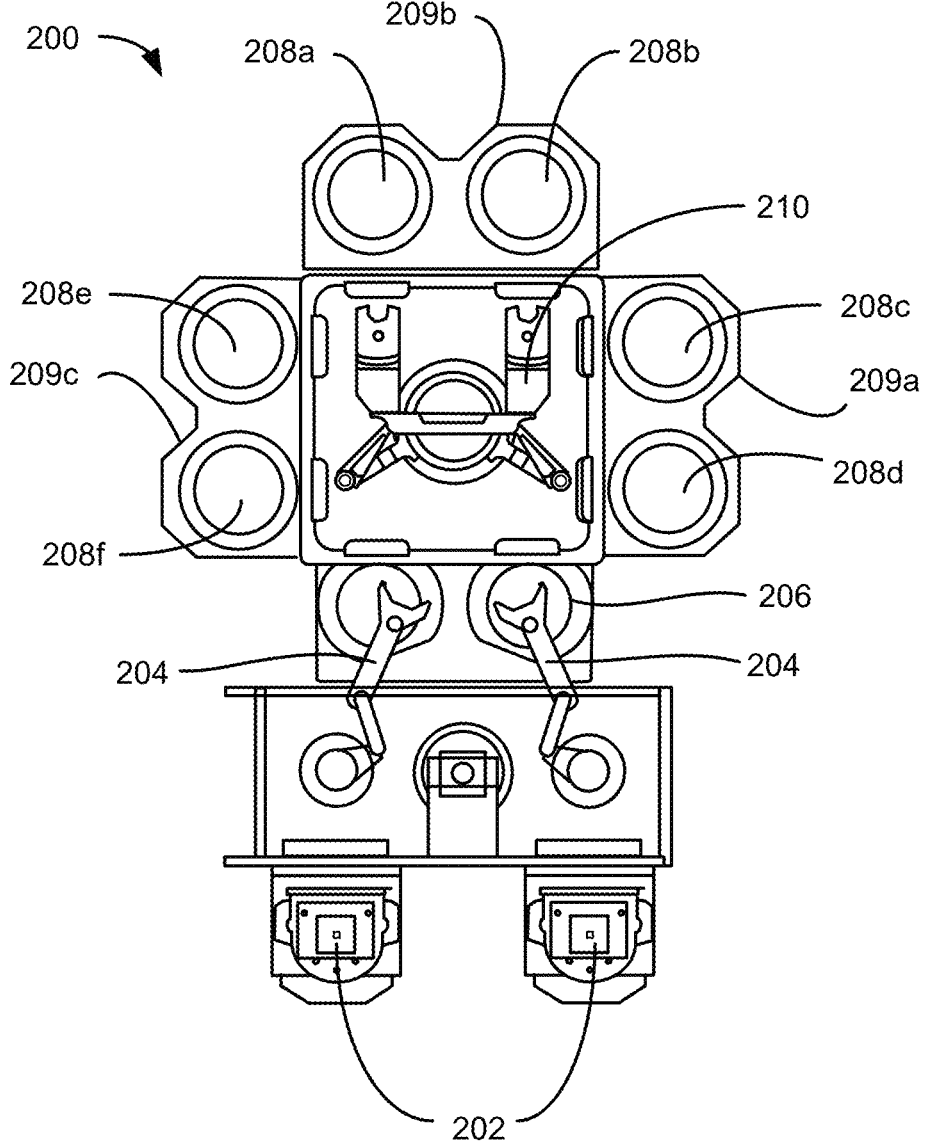
FIG. 2 shows a top plan view of one embodiment of an exemplary processing system according to some embodiments of the present technology.

FIG. 2 shows a top plan view of one embodiment of a processing system 200 of deposition, etching, baking, and curing chambers according to some embodiments of the present technology. In the figure, a pair of front opening unified pods 202 supply substrates of a variety of sizes that are received by robotic arms 204 and placed into a low pressure holding area 206 before being placed into one of the substrate processing chambers 208*a-f*, positioned in tandem sections 209*a-c*. A second robotic arm 210 may be used to transport the substrate wafers from the holding area 206 to the substrate processing chambers 208*a-f* and back. Each substrate processing chamber 208*a-f* can be outfitted to perform a number of substrate processing operations, including the physical vapor deposition processes described herein, in addition to dry etch processes, cyclical layer deposition processes, atomic layer deposition processes, chemical vapor deposition processes, including metal-organic chemical vapor deposition processes, etch processes, pre-clean processes, planarizing processes including chemical-mechanical-polishing processes, anneal processes, plasma processing processes, degas processes, orientation processes, and other semiconductor fabrication processes.

The substrate processing chambers 208*a-f* may include one or more system components for depositing, annealing, curing and/or etching a material film on the substrate or wafer. In one configuration, two pairs of the processing chambers, for example, 208*c-d* and 208*e-f*, may be used to deposit material on the substrate, and the third pair of processing chambers, for example 208*a-b*, may be used to planarize, anneal, cure, or treat the deposited films. In another configuration, all three pairs of chambers, for example, 208*a-f*, may be configured to both deposit and cure a film on the substrate. One or more of the processes described may be carried out in additional chambers separated from the fabrication system shown in different embodiments. It will be appreciated that additional configurations of deposition, etching, annealing, and curing chambers for material films are contemplated by system 200. Additionally, any number of other processing systems may be utilized with the present technology, which may incorporate chambers for performing any of the specific operations. In some embodiments, chamber systems that may provide access to multiple processing chambers while maintaining a vacuum environment in various sections, such as the noted holding and transfer areas, may allow operations to be performed in multiple chambers while maintaining a particular vacuum environment between discrete processes.

Figure 4:
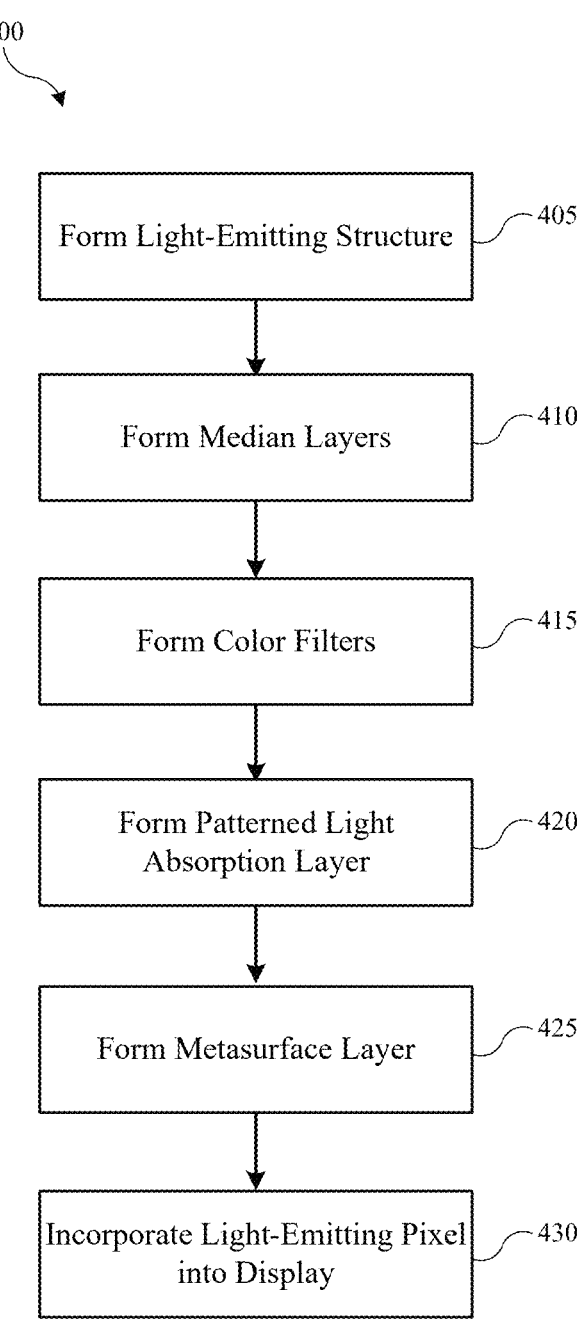
FIG. 4 shows exemplary operations in a method of forming LED semiconductor devices according to some embodiments of the present technology.
Figure 5:
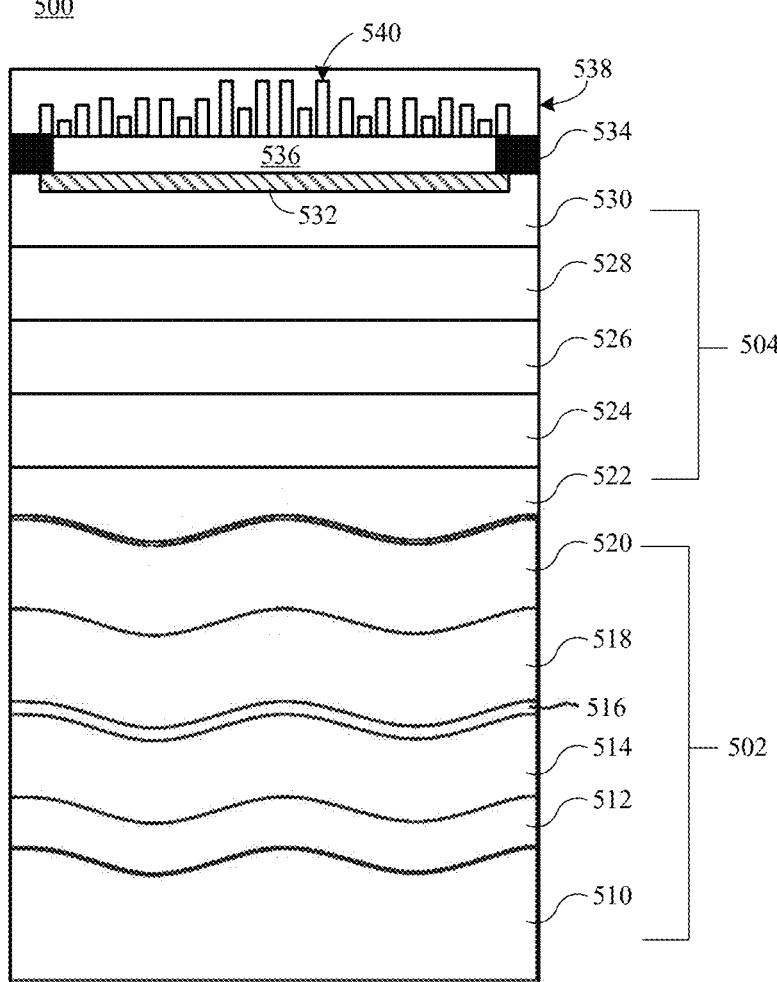
FIG. 5 shows layers of a subpixel from a light field pixel according to embodiments of the present technology.
Figure 6:
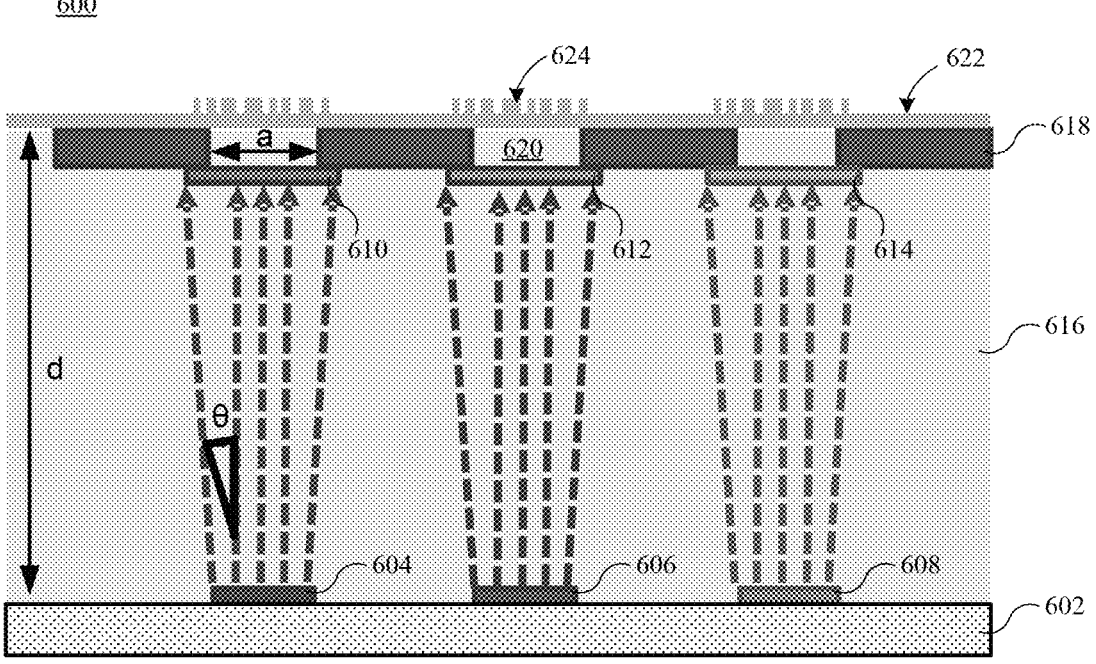
FIG. 6 shows layers of a pixel from a light field pixel according to additional embodiments of the present technology.

System 200, or more specifically chambers incorporated into system 200 or other processing systems, may be used to produce components of light field displays according to embodiments of the present technology, including the light field pixel 300 shown in FIG. 3A, the subpixel 320 shown in FIG. 3B, the nanorods for a metasurface layer shown in FIG. 3C, the subpixel 500 shown in FIG. 5, and the pixel 600 shown in FIG. 6, among other light field display components. System 200 may also be used to carry out operations in processes of making the light field displays. These include methods of making light-emitting pixels structures according to embodiments of the present technology, like method 400 shown in FIG. 4. Method 400 may be performed in one or more processing chambers, such as chambers incorporated in system 200, for example. Method 400 may or may not include one or more operations prior to the initiation of the method, including front-end processing, deposition, etching, polishing, cleaning, or any other operations that may be performed prior to the described operations. The method may include a number of optional operations, which may or may not be specifically associated with some embodiments of methods according to the present technology.

A light field pixel made according to embodiments of the present technology may include light-field pixel 300 shown in FIG. 3A. The light field pixel 300 may include a first array of light-emitting pixels 302 and a second array of metasurface layers 304. In further embodiments, the array of light-emitting pixels 302 may be arranged in a first plane, and the array of metasurface layer 304 may be arranged in a second plane that may be positioned directly over or under the first plane of light-emitting pixels. Light emitted from each of the light-emitting pixels 302 may be directed to pass through one of the metasurface layers 304 that directs the light into one view of an image displayed by a light field display.

In embodiments, the first array of light-emitting pixels 302 in the light field pixel 300 may include greater than or about 2 light-emitting pixels, greater than or about 5 light-emitting pixels, greater than or about 10 light-emitting pixels, greater than or about 25 light-emitting pixels, greater than or about 50 light-emitting pixels, greater than or about 100 light-emitting pixels, greater than or about 500 light-emitting pixels, greater than or about 1000 light-emitting pixels, or more. In additional embodiments, the second array of metasurface layers 304 in the light field pixel 300 may include greater than or about 2 metasurface layers, greater than or about 5 metasurface layers, greater than or about 10 metasurface layers, greater than or about 25 metasurface layers, greater than or about 50 metasurface layers, greater than or about 100 metasurface layers, greater than or about 500 metasurface layers, greater than or about 1000 metasurface layers, or more. In still further embodiments, the light field pixel 300 may produce greater than or about two views of the displayed image. In yet additional embodiments, the light field pixel 300 may produce greater than or about three views, greater than or about four views, greater than or about five views, greater than or about six views, greater than or about seven views, greater than or about eight views, greater than or about nine views, greater than or about ten views, greater than or about twelve views, greater than or about sixteen views, greater than or about twenty-four views, greater than or about thirty-six views, greater than or about forty-eight views, greater than or about sixty-four views, or more.

In additional embodiments, the light-emitting pixels 302 in the light field pixel 300 may include organic light-emitting diode structures (OLEDs) characterized by a high degree of directionality. In embodiments, the directionality of the light emitted by the light-emitting pixels may be characterized by a divergence in the angle of the emitted light from a target direction. In more embodiments, the target direction may be a line that is characterized by a fixed angle of incidence between the line and an incidence surface of a metasurface layer. In yet more embodiments, the fixed angle of incidence may be 90°, and the predominant direction of the collimated light emitted by the light-emitting pixel is perpendicular to the incidence surface of the metasurface layer. In embodiments, the full-width-half-maximum (FWHM) of the intensity of the highly directional light emitted from the light-emitting pixels may be characterized by a divergence angle of less than or about 10°, less than or about 9°, less than or about 8°, less than or about 7°, less than or about 6°, less than or about 5°, less than or about 4°, less than or about 3°, less than or about 2°, less than or about 1°, or less.

In more embodiments, the light-emitting pixels 302 may be characterized by one or more features that increase the directionality of their emitted light. In embodiments, these features may include forming the light-emitting pixel with coupled dimensions between a light generating cavity and a corrugated surface in the pixel that increases the directionality of the emitted light. In further embodiments, the coupled dimensions may include coupling of the height and width of the periodic curves in the corrugated surface with the length and depth of the light-generating cavity to favor the emission of light in a particular direction and at a particular wavelength from the pixel. In still further embodiments, the corrugated surfaces may be characterized by a corrugation period of greater than or about 100 nm, greater than or about 200 nm, greater than or about 300 nm, greater than or about 400 nm, greater than or about 500 nm, greater than or about 600 nm, greater than or about 700 nm, greater than or about 800 nm, greater than or about 900 nm, greater than or about 1000 nm, or more. In yet more embodiments, the corrugated surfaces may be characterized by a peak-to-trough height of greater that or about 5 nm, greater than or about 10 nm, greater than or about 25 nm, greater than or about 50 nm, greater than or about 100 nm, greater than or about 200 nm, greater than or about 300 nm, greater than or about 400 nm, greater than or about 500 nm, or more.

In still more embodiments, the light-emitting pixels may include a number of subpixels. FIG. 3B shows an embodiment of a light-emitting pixel 320 that includes three subpixels 322, 324, and 326. In embodiments, the three subpixels 322, 324, and 326 may be operable to emit light characterized by peak emission wavelengths in the red, green, and blue portions of the visible spectrum, respectively. In further embodiments, the light-emitting pixel 320 may include additional subpixels (not shown), such as a fourth subpixel, a fifth subpixel, or more. In still further embodiments, one of the three subpixels 322, 324, and 326, or an additional subpixel may be operable to emit light across a broad portion of the visible light spectrum (e.g., white light). In still further embodiments, the light-emitting pixel 302 may include an array of two or more light-emitting pixels 320, each of which has a group of subpixels like subpixels 322, 324, and 326. In more embodiments, the light-emitting pixel 302 may include a number of light-emitting pixels 320 that number greater than or about three, greater than or about five, greater than or about ten, greater than or about twenty, greater than or about thirty, greater than or about forty, greater than or about fifty, greater than or about one hundred, or more.

In further embodiments, the metasurface layers 304 in the light field pixel 300 are operable to direct the light emitted by the light-emitting pixels 302 into views of the image displayed on a light field display. In embodiments, the metasurface layers 304 may be operable to direct the light by the inclusion of one or more nanorods in the metasurface layer. FIG. 3C shows embodiments of four types of nanorods that may be included in the metasurface layers 304. The embodiments include circular-shaped nanorods 340, square-shaped nanorods 342, triangular-shaped nanorods 344, and hexagonal-shaped nanorods 346, ellipitical-shaped nanorods, and rectangular-shaped nanorods, among other types of nanorods. Nanorod shapes may further include horseshoe-shaped nanorods, L-shaped nanorods, V-shaped nanorods, and rectangular-shaped nanorods, among other shapes. In additional embodiments, the metasurface layers 304 may include a single type of nanorod or two or more types of nanorods. In still additional embodiments, different metasurface layers 304 may include different types of nanorods. In more embodiments, the nanorods of the same shape may have the same size or may have a distribution of different sizes in a metasurface layer 304. In still more embodiments, the nanorods may be characterized by a longest dimension of less than or about 500 nm, less than or about 250 nm, less than or about 100 nm, less than or about 75 nm. less than or about 50 nm, less than or about 25 nm, less than or about 10 nm, or less.

In more embodiments, the metasurface layers 304 may include a filler material between the nanorods. In further embodiments, the nanorods may have a higher refractive index than the filler material. In still further embodiments, the difference in the refractive index between the nanorods and the filler material may be greater than or about 0.1, greater than or about 0.2, greater than or about 0.3, greater than or about 0.4, greater than or about 0.5, greater than or about 0.6, greater than or about 0.7, greater than or about 0.8, greater than or about 0.9, greater than or about 1.0, or more.

In embodiments, the shape, size, concentration, and index of refraction of the nanorods may control the direction of the light transmitted through the metasurface layers 304 from the light-emitting pixels 302. In some embodiments, metasurface layers having nanorods with higher indices of refraction, shorter dimensions, and a larger thickness of the metasurface layer may deflect light to a greater extent. In further embodiments, the composition of the nanorods may depend on the wavelength of the light transmitted through the metasurface layer. For example, shorter wavelengths of light may be deflected to a greater extent by a metasurface layer than longer wavelengths of light.

FIG. 4 shows exemplary operations in a method 400 of forming light-emitting pixel structures according to some embodiments of the present technology. Method 400 may be used to make the subpixel structure 500 shown in FIG. 5 and the pixel structure 600 shown in FIG. 6. Method 400 may include forming a light-emitting structure at operation 405. In embodiments, operation 405 may include forming the organic light-emitting diode (OLED) structure 502 in subpixel 500 and forming the light-emitting structures 604, 606, and 608, in pixel 600. In further embodiments, operation 405 may include providing a substrate 510 upon which the layers of an OLED structure 502 is formed, including a first (e.g., bottom) electrode layer 512, a group of organic layers 514, 516, 518, and second (e.g., top) electrode layer 520. In more embodiments, the OLED structure 502 is designed to generate light from an emissive organic layer (e.g., organic layer 516) upon the flow charge carriers (e.g., electrons and holes) between the first and second electrodes 512 and 520. The light emitted by the emissive organic layer 516 may be characterized by a peak wavelength intensity in a portion of the visible spectrum. In embodiments, the emissive organic layer 516 may be characterized by a peak wavelength intensity of about 620 nm to 750 nm (red light), about 495 nm to about 570 nm (green light), or about 450 nm to 495 nm (blue light), among other peak wavelength intensities. The emissive organic layer 516 is operable to generate light with a peak wavelength intensity that depends on the types and amounts of organic molecules in the layer that emit light after being activated by the charge carriers.

In additional embodiments, the substrate 510 in OLED structure 502 may be made from one or more of silicon oxide (a.k.a. glass), plastic, metal foil such as aluminum or copper foil, among other metal foils, and organic polymers such as polyethylene terephthalate (PET), polyethylene naphthalate (PEN), or polyimide (PI), among other organic polymers. In further embodiments, the substrate 510 may be a planar substrate layer that includes one or more control device structures for generating images on a display device. In embodiments, the control device structures may include device layers such as buffer layers, interlayer dielectric layers, insulating layers, active layers, and electrode layers, among other kinds of layers. In more embodiments, the control device structures may include one or more types of display driving backplane circuits. In still more embodiments, the substrate 510 may be transparent to wavelengths of light generated by the emissive organic layer 516 of the OLED structure 502.

In further embodiments, the first electrode layer 512 may be in contact with a surface of the substrate 510. In still further embodiments, the first electrode layer 512 may be an electrically conductive layer made from one or more types of electrically conductive material. In embodiments, the first electrode layer 512 may be made from at least one material, such as a conductive oxide or a metal. In additional embodiments, the conductive oxides may include indium-tin-oxide (ITO), indium-zinc-oxide (IZO), fluorine-doped tin oxide (FTO), and doped zinc oxide, among other conductive oxides. In yet additional embodiments, the metals may include silver, gold, magnesium, aluminum, copper, and tin, among other metals.

In more embodiments, a group of organic layers 514, 516, and 518 may be positioned on the first electrode layer 512 in the OLED structure 502. In embodiments, the organic layers may include a hole transport layer 514, and an emissive layer 516, and an electron transport layer 518. In additional embodiments, the hole transport layer 514 may be in contact with the first electrode layer 512, which may be acting as a positively biased anode electrode. The positively charged holes originating in the first electrode layer 512 may be transported through the hole transport layer 514 into the emissive layer 516. In further embodiments, the electron transport layer 518 may be in contact with the second electrode layer 520, which may be acting as a negatively biased cathode electrode. The negatively charged electrons originating in the second electrode layer 520 may be transported through the electron transport layer 518 into the emissive layer 516. In yet further embodiments, the holes and electrons traveling through the hole and electron transport layers 514 and 518 may recombine in the emissive layer 516 through a charge transfer pathway that activates light-emitting compounds in the emissive layer to emit light. In further embodiments, the group of organic layers may also include a hole injection layer (not shown) positioned between the first electrode layer 512 and the hole transport layer 514. In still further embodiments, the group of organic layers may further include an electron injection layer (not shown) positioned between the second electrode layer 520 and the electron transport layer 518.

In more embodiments, the organic layer 514 may include N,N'-di(1-naphthyl)-N,N'-diphenyl-(1,1'-biphenyl)-4,4'-diamine (NPB), among other organic compounds. In yet more embodiments, the organic layer 514 may be characterized by a non-zero thickness less than or about 300 nm, less than or about 200 nm, less than or about 150 nm, less than or about 120 nm, less than or about 100 nm, less than or about 75 nm, less than or about 50 nm, or less. In still more embodiments, organic layer 516 may include 4,4'-bis(N-carbazolyl)-1,1'-biphenyl (CBP), among other organic compounds. In additional embodiments, the organic layer 516 may be characterized by a non-zero thickness less than or about 50 nm, less than or about 40 nm, less than or about 30 nm, less than or about 20 nm, less than or about 10 nm, or less. In further embodiments, organic layer 518 may include 2,2',2"-(1,3,5-benzinetrilyl)-tris(1-phenyl-1-H-benzimidazole) (TPBi), among other organic compounds. In still further embodiments, the organic layer 518 may be characterized by a non-zero thickness less than or about 300 nm, less than or about 200 nm, less than or about 140 nm, less than or about 120 nm, less than or about 100 nm, less than or about 75 nm, less than or about 50 nm, less than or about 20 nm, or less. In more embodiments, the hole injection layer may include hexanitrile hexaazatriphenylene (HATCN), among other organic compounds. In yet more embodiments, the electron injection layer may include a lithium fluoride (LiF) layer, and a magnesium silver (Mg:Ag) layer, among other kinds of layers.

In still more embodiments, the second electrode layer 520 may be in contact with a surface of a top layer of the group of organic layers (e.g. organic layer 518). In still further embodiments, the second electrode layer 520 may be a transparent and electrically conductive layer made from one or more types of transparent, electrically conductive material. In embodiments, the second electrode layer 520 may be made from at least one material, such as a transparent-conductive oxide such as indium-tin-oxide (ITO). In additional embodiments, the second electrode 520 may include indium-zinc-oxide (IZO), fluorine-doped tin oxide (FTO), and doped zinc oxide, among other oxides.

In embodiments, the OLED structure 502 may be characterized by corrugated surfaces in one or more of the substrate 510, organic layers 514, 516, and 518, and electrode layers 512, 520. In further embodiments, the corrugated surfaces may be characterized by a wave pattern that has a height and periodicity that is coupled to the dimensions of a waveguide cavity in the emissive layer 516 to bias the emission of light with an increased directionality and increased monochromaticity. In embodiments, the highly-directional light emitted by the OLED structure 502 may be characterized by a divergence angle of less than or about $10°$, less than or about $9°$, less than or about $8°$, less than or about $7°$, less than or about $6°$, less than or about $5°$, less than or about $4°$, less than or about $3°$, less than or about $2°$, less than or about $1°$, or less. In further embodiments, the highly-monochromatic light emitted by the OLED structure 502 may be characterized by a full-width-half-maximum (FWHM) distribution of less than or about 150 nm, less than or about 100 nm, less than or about 75 nm, less than or about 50 nm, or less.

In embodiments, a group of light-emitting structures like OLED structure 502 may be formed into a light emission layer. FIG. 6 shows light-emitting structures 604, 606, and 608 formed into a light emission layer on substrate 602 in pixel 600. In additional embodiments, the light emission layer may include greater than or about 2 light-emitting structures, greater than or about 3 light-emitting structures, greater than or about 5 light-emitting structures, greater than or about 10 light-emitting structures, greater than or about 20 light-emitting structures, greater than or about 30 light-emitting structures, greater than or about 40 light-emitting structures, greater than or about 50 light-emitting structures, greater than or about 100 light-emitting structures, or more. In further embodiments, each of the light-emitting structures may be characterized by a width of less than or about 50 μm, less than or about 40 μm, less than or about 30 μm, less than or about 20 μm, less than or about 10 μm, or less. In yet further embodiments, the light-emitting structures may be separated from each other by an edge-to-edge distance of less than or about 100 μm, less than or about 75 μm, less than or about 50 μm, less than or about 40 μm, less than or about 30 μm, less than or about 20 μm, less than or about 10 μm, less than or about 5 μm, or less.

Method 400 may include forming one or more median layers on the light-emitting structures at operation 410. In the embodiment shown in FIG. 5, median layers 504 are formed on the light-emission structure 502. In FIG. 6, a layer of median material 616 separates the light-emitting structures 604, 606, and 608 from the color filters 610, 612, and 614, and the patterned light absorption barrier 618. In embodiments, the number of median layers formed on the light-emitting structures may be greater than or about one, greater than or about two, greater than or about three, greater than or about four, greater than or about five, or more. In further embodiments, the distance between a light emission layer and a pattered light absorption barrier that is created by the one or more median layers may be greater than or about 20 μm, greater than or about 30 μm, greater than or about 40 μm, greater than or about 50 μm, greater than or about 60 μm, greater than or about 70 μm, greater than or about 80 μm, greater than or about 90 μm, greater than or about 100 μm, greater than or about 120 μm, greater than or about 150 μm, greater than or about 180 μm, greater than or about 200 μm, or more.

In further embodiments, the distance between the light emission layer and the pattered light absorption barrier may depend on the width of an opening in the patterned light absorption barrier that blocks light emitted from the light-emitting structures that has an incident angle greater than a cutoff angle for the light passing through the opening. In embodiments, these may include opening 536 defined by patterned light absorption barrier 534 in subpixel 500, and openings 620 defined by the patterned light absorption barrier 618 in pixel 600. In further embodiments, the subpixel or pixel may define a ratio between a distance (e.g., distance "d" in FIG. 6) between the light emission layer and the pattered light absorption barrier and a width (e.g., width "a" in FIG. 6) of the opening in the patterned light absorption barrier. In still further embodiments, a ratio of (i) the distance between the light emission layer and the pattered light absorption barrier, and (ii) the width of the opening in the patterned light absorption barrier may be greater than or about 5:1, greater than or about 5.5:1, greater than or about 6:1, greater than or about 6.5:1, greater than or about 7:1, greater than or about 7.5:1, greater than or about 8:1, greater than or about 8.5:1, greater than or about 9:1, greater than or about 9.5:1, greater than or about 10:1, or more.

In additional embodiments, the distance-to-width ratio may be set to block light emitted from the light-emitting structures characterized by a divergence angle (e.g., angle "θ" in FIG. 6) that is greater than or about 5°, greater than or about 10°, greater than or about 15°, greater than or about 20°, greater than or about 25°, greater than or about 30°, or more. As noted above, blocking light that exceeds a threshold divergence angle reduces or eliminates sidelobe light patterns in the light that forms a view of an image in a light field display. The reduction or elimination of these sidelobe emission patterns reduces the display of unwanted ghost images on a light field display.

In additional embodiments, the one or more median layers formed in operation 410 may include the formation of a multi-layer structure that includes a thin-film-encapsulation (TFE) and one or more organic layers. In further embodiments, the median layers 504 may be characterized as a multi-layer structure that includes a combination of dielectric layers and organic layers. In embodiments, the median layers 504 may include first, second, and third dielectric layers 522, 526, and 530, and first and second organic layers 524 and 528. In additional embodiments, the first, second, and third dielectric layers 522, 526, and 530 may include one or more dielectric materials such as silicon nitride, silicon oxide, silicon-oxy-nitride, and aluminum oxide, among other dielectric oxide materials. In yet additional embodiments, the first and second organic layers 524 and 528 may include acrylic polymers. In more embodiments, the median layers 504 may alternate between layers having a high and low refractive index. In embodiments, the first, second, and third dielectric layers 522, 526, and 530 may be characterized by refractive indexes of greater than or about 1.6, greater than or about 1.7, greater than or about 1.8, or more. In additional embodiments, the first and second organic layer 524 and 528 may be characterized by refractive indexes of less than or about 1.5, less than or about 1.4, less than or about 1.3, or less.

Method 400 may further include forming color filters over the median layers in operation 415. In embodiments, the color filters may include color filter 532 in subpixel 500 and color filters 610, 612, and 614 in pixel 600. In further embodiments, the color filters may be operable to transmit light of a proximately positioned light-emitting structure and block the transmission of light at other wavelengths. In additional embodiments, the color filters may make contact with a patterned light absorption layer (e.g., layer 534, 618). In still additional embodiments, each color filter may span the width of an opening defined by the patterned light absorption layer.

Method 400 may additionally include forming a patterned light absorption layer on the median layers at operation 420. The patterned light absorption layer defines a group of openings in the layer that permit a portion of the light from light-emitting structures to travel through the light absorption layer. In embodiments, these openings may include opening 536 in the patterned light absorption layer 534, and openings 620 in the patterned light absorption layer 618. In additional embodiments, the patterned light absorption layer may be formed by depositing a light-blocking material on the median layers and color filters of one or more light-emitting pixels. In still additional embodiments, the light blocking material may be deposited as a blanket light-blocking layer having a thickness greater than or about 1 μm, greater than or about 2.5 μm, greater than or about 5 μm, greater than or about 7.5 μm, greater than or about 10 μm, or more. In more embodiments, the deposited light blocking material may be photo-lithographically patterned to form the openings in the patterned light absorption layer. In embodiments, each of the openings may be aligned with a light-emitting structure, as seen in the alignment of opening 536 with the light-emitting structure 502 and each of the openings 620 with light-emitting structures 604, 606, and 608, respectively. In further embodiments, the alignment of the openings and the light-emitting structures may be characterized by the vertical alignment of a center position in an opening with a center position in a light-emitting structure. In still further embodiments, the openings patterned into the light absorption layer may include one or more shapes such as circular, elliptical, square, rectangular, and trapezoidal, among other shapes.

In more embodiments, the light blocking material may include a combination of an organic polymer matrix and a light-absorbing compound such as a light-absorbing pigment or carbon black. In still more embodiments, the patterned light absorption layer may be characterized by an optical density of greater than or about $2.0\ \mu m^{-1}$, greater than or about $2.25\ \mu m^{-1}$, greater than or about $2.5\ \mu m^{-1}$, greater than or about $2.75\ \mu m^{-1}$, greater than or about 3.0 $\mu m^{-1}$, greater than or about $3.25\ \mu m^{-1}$, greater than or about 3.5 $\mu m^{-1}$, greater than or about $3.75\ \mu m^{-1}$, greater than or about $4.0\ \mu m^{-1}$, or more.

Method 400 may also include forming a metasurface layer on the light absorption layer at operation 425. The metasurface layer directs light emitted through the openings defined in the patterned light absorption layer into views of an image projected on a display, such as a light field display. In embodiments, metasurface layers may include the metasurface layer 538 formed on subpixel 500 and metasurface layer 622 formed on pixel 600. In further embodiments, the metasurface layers may include nanorods, such as nanorods 540 in metasurface layer 538 and nanorods 624 in metasurface layer 622. The nanorods assist in the directing of the light emitted from the openings in a patterned light absorption layer onto a display.

Method 400 may still also include incorporating light-emitting pixels into a display at operation 430. In embodiments, operation 430 may include the placement of a matrix of light-emitting pixels on a backplane substrate that includes control devices for activating the individual subpixels of each of the light-emitting pixels. In further embodiments, the operation may further include placing a display screen on the matrix of light-emitting pixels. In still further embodiments, the display may be a light field display operable to display three-dimensional images.

Embodiments of the present technology like method 300 to make subpixel 500 and pixel 600 include operations to make components of a light field display with improved image quality compared to conventional light field displays that project views of an image with less directional light. In embodiments, the present technology addresses the problem of ghost images in the displayed three-dimensional image by reducing or eliminating sidelobe patterns in the light that illuminates the image. High-intensity sidelobe patterns are prevented by blocking the majority of divergent light rays from the light-emitting structures with a patterned light absorption layer.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either of the limits, both of the limits, or neither of the limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a trench" includes a plurality of such trenches, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A light-emitting pixel structure comprising:

a group of light-emitting diode structures, wherein each of the light-emitting diode structures is operable to emit light characterized by a different peak emission wavelength, and each light-emitting diode structure includes a corrugated bottom electrode, a corrugated hole transport layer, a corrugated emissive organic layer, a corrugated electron transport layer, and a corrugated top electrode;

median layers on the light emission layer, wherein the median layers comprise a plurality of organic layers with refractive indices less than about 1.5 alternating between a plurality of dielectric layers with refractive indices greater than about 1.6;

a color filter layer comprising color filters positioned above the group of light-emitting diode structures;

a patterned light absorption barrier characterized by a group of openings in the barrier, wherein each of the openings permit a transmission of a portion of the light from one of the light-emitting diode structures through the barrier, and a bottom of the barrier is formed above a top of the color filter layer; and a metasurface layer formed above a top of the patterned light absorption barrier and operable to change a direction of at least some of the light transmitted through the openings of the patterned light absorption barrier from the light-emitting diode structures.

2. The light-emitting pixel structure of claim 1, wherein the patterned light absorption barrier is operable to block a second portion of the light from the light-emitting diode structures that is characterized by a divergence angle greater than or about 30°, and wherein the divergence angle is an angle between a first line that is perpendicular to an absorbing surface of the patterned light absorption barrier and a second line that is parallel to a direction of the second portion of the light.

3. The light-emitting pixel structure of claim 1, wherein the patterned light absorption barrier is operable to reduce an emission intensity of a sidelobe image from the light-emitting pixel structure by greater than or about 90% compared to a light-emitting pixel structure without the patterned light absorption barrier.

4. The light-emitting pixel structure of claim 1, wherein the openings in the patterned light absorption barrier are characterized by a non-zero width that is less than or about 20 µm.

5. The light-emitting pixel structure of claim 1, wherein the patterned light absorption barrier is separated from the group of light-emitting diode structures by a height that is greater than or about 50 µm.

6. The light-emitting pixel structure of claim 1, wherein the patterned light absorption barrier is characterized by a thickness that is greater than or about 2.5 μm.

7. The light-emitting pixel structure of claim 1, wherein the group of light-emitting diode structures comprise organic light-emitting diode structures.

8. The light-emitting pixel structure of claim 1, wherein the light-emitting pixel structure is part of a three-dimensional light field display.

9. A light-emitting pixel structure comprising:

a light emission layer comprising a group of light-emitting diode structures, wherein each light-emitting diode structure includes a corrugated bottom electrode, a corrugated hole transport layer, a corrugated emissive organic layer, a corrugated electron transport layer, and a corrugated top electrode;

median layers on the light emission layer, wherein the median layers comprise a plurality of organic layers with refractive indices less than about 1.5 alternating between a plurality of dielectric layers with refractive indices greater than about 1.6;

a patterned light absorption barrier positioned a distance from the light emission layer, wherein the patterned light absorption barrier defines a group of openings in the barrier to transmit light from the group of light-emitting diode structures through the barrier, and wherein a ratio of the distance between the patterned light absorption barrier and the light emission layer and a width of each of the openings in the patterned light absorption barrier is greater than or about 5:1;

a color filter directly adjacent to each of the openings in the patterned light absorption barrier, wherein the color filter is operable to pass light characterized by a wavelength range emitted from a subpixel in the light emission layer while blocking light outside the wavelength range, and a top of the color filter is positioned below a bottom of the barrier; and a metasurface layer on the patterned light absorption barrier, wherein the metasurface layer includes one or more nanorods in the metasurface layer and a filler material between the nanorods, and a direction of at least some of the light is controlled by a shape, size, concentration, or index of refraction of the nanorods.

10. The light-emitting pixel structure of claim 9, wherein the structure further comprises a metasurface layer operable to change a direction of at least some of the light transmitted through the openings of the patterned light absorption barrier from the light-emitting diode structures.

11. The light-emitting pixel structure of claim 9, wherein the light-emitting diode structures are separated from each other by an edge-to-edge distance of less than or about 100 μm.

12. The light-emitting pixel structure of claim 9, wherein the patterned light absorption barrier is operable to reduce an emission intensity of a sidelobe image from the light-emitting pixel structure by greater than or about 90% compared to a light-emitting pixel structure without the patterned light absorption barrier.

13. The light-emitting pixel structure of claim 9, wherein the group of light-emitting diode structures in the light emission layer comprises directional light-emitting diode structures characterized by a FWHM of emitted light having a divergence angle of less than or about 10°.

14. The light-emitting pixel structure of claim 9, wherein the light-emitting pixel structure is part of a three-dimensional light field display.

15. A light-emitting-pixel processing method comprising:

forming a light-emission layer on substrate, wherein the light emission layer comprises a group of light-emitting diode structures, wherein each light-emitting diode structure includes a corrugated bottom electrode, a corrugated hole transport layer, a corrugated emissive organic layer, a corrugated electron transport layer, and a corrugated top electrode;

forming median layers on the light emission layer, wherein the median layers comprise a plurality of organic layers with refractive indices less than about 1.5 alternating between a plurality of dielectric layers with refractive indices greater than about 1.6;

forming a color filter layer that is operable to pass light characterized by a wavelength range emitted from a subpixel in the light emission layer while blocking light outside the wavelength range, and a bottom of the color filter layer is formed above a top of the median layers;

forming a patterned light absorption barrier, wherein the patterned light absorption barrier defines a group of openings in the barrier to transmit light from the group of light-emitting diode structures through the barrier, a ratio of a distance between the patterned light absorption barrier and the light emission layer and a width of each of the openings in the patterned light absorption barrier is greater than 10:1, and a bottom of the barrier is formed above a top of the color filter layer; and forming a metasurface layer on the patterned light absorption barrier, wherein the metasurface layer includes one or more nanorods in the metasurface layer and a filler material between the nanorods, and a direction of at least some of the light is controlled by a shape, size, concentration, or index of refraction of the nanorods.

16. The light-emitting-pixel processing method of claim 15, wherein the method further comprises forming a metasurface layer on the patterned light absorption barrier, wherein the metasurface layer is operable to change a direction of at least some of the light transmitted through the openings of the patterned light absorption barrier from the light-emitting diode structures.

17. The light-emitting-pixel processing method of claim 15, wherein the patterned light absorption barrier is operable to reduce an emission intensity of a sidelobe image from the light-emitting pixel by greater than or about 90% compared to a light-emitting pixel without the patterned light absorption barrier.

18. The light-emitting-pixel processing method of claim 15, wherein the distance between the patterned light absorption barrier and the light emission layer is greater than or about 50 μm.

19. The light-emitting-pixel processing method of claim 15, wherein the group of light-emitting diode structures in the light-emission layer comprise directional light-emitting diode structures characterized by a FWHM of emitted light having a divergence angle of less than or about 10°.

20. The light-emitting-pixel processing method of claim 15, wherein the method further comprises incorporating the light-emitting-pixel into a three-dimensional light field display.

\* \* \* \* \*